United States Patent
Lee et al.

(10) Patent No.: US 9,599,894 B2
(45) Date of Patent: Mar. 21, 2017

(54) INFRARED TRANSMISSION PHOTOSENSITIVE RESIN COMPOSITION

(71) Applicant: DONGWOO FINE-CHEM CO., LTD., Jeollabuk-do (KR)

(72) Inventors: Seung No Lee, Gyeonggi-do (KR); Yu Bin Im, Jeollabuk-do (KR); Wan Joong Kim, Daejeon (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 15/064,087

(22) Filed: Mar. 8, 2016

(65) Prior Publication Data
US 2016/0282716 A1    Sep. 29, 2016

(30) Foreign Application Priority Data
Mar. 27, 2015  (KR) .......... 10-2015-0043633

(51) Int. Cl.
| | |
|---|---|
| *G03F 7/028* | (2006.01) |
| *G02B 5/20* | (2006.01) |
| *G03F 7/00* | (2006.01) |
| *G03F 7/038* | (2006.01) |
| *G02B 5/22* | (2006.01) |

(52) U.S. Cl.
CPC .......... *G03F 7/0007* (2013.01); *G02B 5/201* (2013.01); *G02B 5/208* (2013.01); *G02B 5/223* (2013.01); *G03F 7/028* (2013.01); *G03F 7/038* (2013.01)

(58) Field of Classification Search
CPC ........ G03F 7/0007; G03F 7/038; G03F 7/027; G03F 7/028; G03F 7/031; G03F 7/032; G02B 5/201; G02B 5/208; G02B 5/223; H01L 27/14649; H01L 27/14645
USPC .............. 430/7, 270.1, 281.1; 257/440
See application file for complete search history.

(56) References Cited

U.S. PATENT DOCUMENTS

2015/0260885 A1* 9/2015 Takishita ............... C08F 2/50
250/338.1

FOREIGN PATENT DOCUMENTS

KR    10-2014-0147531 A    12/2014
WO    WO 2014/084147 A1 *  6/2014

OTHER PUBLICATIONS

Computer-generated translation of KR 2014-0147531 (Dec. 2014).*

* cited by examiner

*Primary Examiner* — John A McPherson
(74) *Attorney, Agent, or Firm* — The PL Law Group, PLLC

(57) ABSTRACT

An infrared transmission photosensitive resin composition includes (A) a pigment dispersion composition including a coloring agent (a1); (B) an alkaline soluble resin; (C) a photo-polymerizable compound; (D) a photo-polymerization initiator; and (E) a solvent, wherein the coloring agent (a1) includes a blue pigment, a red pigment and a yellow pigment. Thereby, the infrared transmission photosensitive resin composition may form an infrared transmission pixel which exhibits a high transmittance in an infrared region while having a very low transmittance in a visible light region, so as to be used in an image sensor for obtaining an image having excellent image quality at a place where the quantity of light is insufficient.

8 Claims, 1 Drawing Sheet

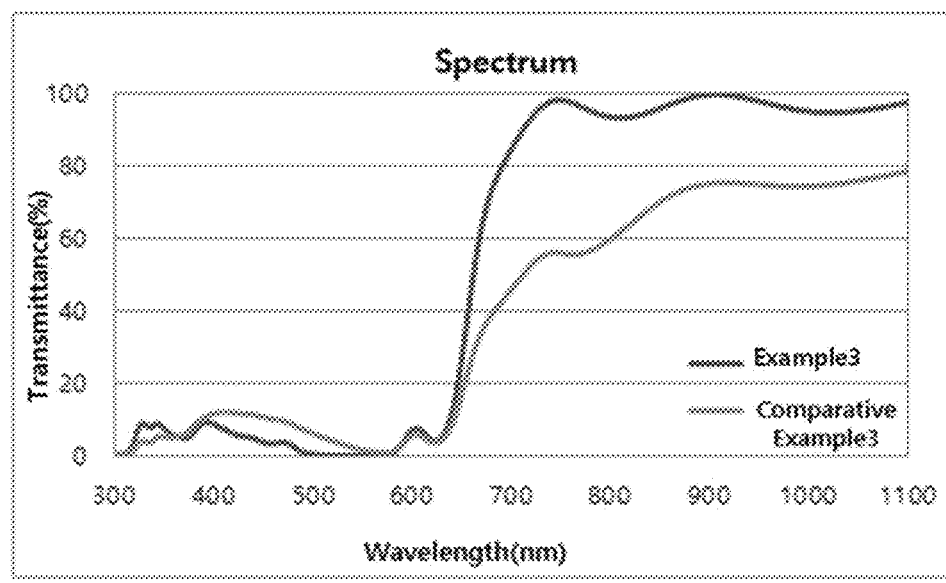

INFRARED TRANSMISSION PHOTOSENSITIVE RESIN COMPOSITION

CROSS-REFERENCE TO RELATED APPLICATION

The present application claims priority to Korean Patent Application No. 10-2015-0043633, filed on Mar. 27, 2015, the disclosure of which is incorporated herein by reference in its entirety.

BACKGROUND

1. Field of the Invention

The present invention relates to an infrared transmission photosensitive resin composition, and more particularly, to an infrared transmission photosensitive resin composition capable of forming an infrared transmission pixel which has a high infrared transmittance and a low visible light transmittance.

2. Description of the Related Art

Generally, an image sensor is a semiconductor device which converts an optical image to an electrical signal. As the image sensor, there are image sensors such as a charge coupled device (CCD), a complementary metal oxide semiconductor (CMOS), and the like.

Among the image sensors, the CMOS image sensor uses CMOS manufacturing techniques, such that it may have a low power consumption, and may be advantageous for integration so as to manufacture a product in a small size. Accordingly, the CMOS image sensor is used in various digital devices such as a digital still camera, a digital video camera, and the like.

The CMOS image sensor has a following general structure. First, a photo diode, an interlayer insulation film, metal wirings, a metal interlayer insulation film, a passivation layer, a color filter array, micro-lenses, and the like are formed on a silicon substrate to fabricate the CMOS image sensor. Among the components, the color filter array means a color pixel of R, G and B, a color pixel of C, M and Y, or the like.

In this regard, a typical color filter array may obtain a color image by allowing only a visible light region to be transmitted therethrough. However, with a size of a unit pixel forming the color filter array being decreased in recent years, an amount of light that can be received per unit area is also decreased, thus there is a disadvantage that it is difficult to obtain a photograph having excellent image quality at a place where the quantity of light is insufficient.

To overcome the above-described disadvantage, a color filter array having a transmission pixel additionally added to the existing color pixel of R, G and B, or the color pixel of C, M and Y has been proposed. The color filter array has an advantage of being capable of obtaining an image having excellent quality by acquiring an infrared image and combining it with an existing visible light image when the quantity of light is insufficient, and securing a three-dimensional image by converting the obtained image to information on a distance between an object.

Meanwhile, Korean Patent Laid-Open Publication No. 2014-147531 discloses a photosensitive resin composition for a black matrix which has a transmittance in an infrared region, but the composition has a disadvantage that the transmittance in the infrared region is insufficient due to containing carbon black based on the contents disclosed therein.

SUMMARY

Accordingly, it is an object to provide an infrared transmission photosensitive resin composition capable of forming an infrared transmission pixel which exhibits a high transmittance in an infrared region.

In addition, another object of the present invention is to provide an infrared transmission pixel prepared by the infrared transmission photosensitive resin composition.

Further, another object of the present invention is to provide an image sensor including the infrared transmission pixel, which is capable of obtaining an image having excellent quality in a situation that the quantity of light is insufficient, and securing a three-dimensional image by converting the obtained image to information on a distance between an object.

The above objects of the present invention will be achieved by the following characteristics:

(1) An infrared transmission photosensitive resin composition, including: (A) a pigment dispersion composition including a coloring agent (a1); (B) an alkaline soluble resin; (C) a photo-polymerizable compound; (D) a photo-polymerization initiator; and (E) a solvent, wherein the coloring agent (a1) includes a blue pigment, a red pigment and a yellow pigment.

(2) The infrared transmission photosensitive resin composition according to the above (1), wherein the coloring agent (a1) includes the blue pigment, the red pigment and the yellow pigment in an amount of 10 to 70% by weight, respectively.

(3) The infrared transmission photosensitive resin composition according to the above (1), herein the coloring agent (a1) includes the blue pigment in an amount of 40 to 70% by weight, the red pigment in an amount of 10 to 40% by weight and the yellow pigment in an amount of 10 to 30% by weight.

(4) The infrared transmission photosensitive resin composition according to the above (1), herein the coloring agent (a1) includes a black pigment in an amount of 5% by weight or less.

(5) The infrared transmission photosensitive resin composition according to the above (1), herein the coloring agent (a1) is included in an amount of 40 to 70% by weight, to a total weight of the infrared transmission photosensitive resin composition in terms of solid content.

(6) The infrared transmission photosensitive resin composition according to the above (1), wherein the blue pigment includes at least one selected from a group consisting of 15:3, 15:4, 15:6, 16, 21, 28, 60, 64 and 76, the red pigment includes at least one selected from a group consisting of C.I. Pigment Red 9, 97, 105, 122, 123, 144, 149, 166, 168, 176, 177, 179, 180, 192, 215, 216, 224, 242, 254, 255 and 264, and the yellow pigment includes at least one selected from a group consisting of C.I. Pigment Yellow 20, 24, 31, 53, 83, 86, 93, 94, 109, 110, 117, 125, 137, 138, 139, 147, 148, 150, 153, 154, 166, 173, 180 and 185.

(7) The infrared transmission photosensitive resin composition according to the above (1), wherein the composition includes 10 to 80% by weight of the (A) pigment dispersion composition, 10 to 80% by weight of the (B) alkaline soluble resin, 5 to 45% by weight of the (C) photo-polymerizable compound, and 0.1 to 40% by weight of the (D) photo-polymerization initiator, to a total weight of the infrared transmission photosensitive resin composition in terms of solid content, and 100 to 300 parts by weight of the (E) solvent, to 100 parts by weight of the infrared transmission photosensitive resin composition in terms of solid content.

(8) An infrared transmission photosensitive resin composition, including: (A) a pigment dispersion composition including a coloring agent (a1); (B) an alkaline soluble resin; (C) a photo-polymerizable compound; (D) a photo-polymerization initiator; and (E) a solvent, wherein the coloring agent (a1) includes a blue pigment, a red pigment and a yellow pigment, and includes a black pigment in an amount of 5% by weight or less.

(9) An infrared transmission pixel which is manufactured by the infrared transmission photosensitive resin composition.

(10) The infrared transmission pixel according to the above (9), wherein a transmittance at a wavelength of 390 nm is 10% or less, the transmittance at a wavelength of 650 nm is 40% or less, and the transmittance at wavelength in a range of 720 nm to 1100 nm is 90%.

(11) A color filter array including the infrared transmission pixel according to the above (9).

(12) An image sensor including the color filter array according to the above (11).

The infrared transmission photosensitive resin composition of the present invention may form the infrared transmission pixel which exhibits a high transmittance in an infrared region while having a very low transmittance in a visible light region.

When the infrared transmission pixel manufactured by the infrared transmission photosensitive resin composition of the present invention is applied to an image sensor, it is possible to obtain an image having excellent image quality at a place where the quantity of light is insufficient due to an increased infrared transmittance, while not affecting the formation of color image due to a reduced visible light transmittance.

The infrared transmission photosensitive resin composition of the present invention may form a pattern having excellent straightness with no residue occurred therein.

BRIEF DESCRIPTION OF THE DRAWINGS

The above and other objects, features and other advantages of the present invention will be more clearly understood from the following detailed description taken in conjunction with the accompanying drawing, in which:

FIG. 1 is a graph illustrating transmittance for each wavelength of patterns formed by infrared transmission photosensitive resin compositions of Example 3 and Comparative Example 3.

DETAILED DESCRIPTION

The present invention discloses an infrared transmission photosensitive resin composition, which includes (A) a pigment dispersion composition including a coloring agent (a1); (B) an alkaline soluble resin; (C) a photo-polymerizable compound; (D) a photo-polymerization initiator; and (E) a solvent, wherein the coloring agent (a1) includes a blue pigment, a red pigment and a yellow pigment. Thereby, the infrared transmission photosensitive resin composition may form an infrared transmission pixel which exhibits a high transmittance in an infrared region while having a very low transmittance in a visible light region, so as to be used in an image sensor for obtaining an image having excellent image quality at a place where the quantity of light is insufficient.

Hereinafter, the present invention will be described in detail.

(A) Pigment Dispersion Composition

The pigment dispersion composition (A) includes a coloring agent (a1).

The coloring agent (a1) is a pigment for performing an infrared transmission function. The coloring agent (a1) according to the present invention includes a blue pigment, a red pigment and a yellow pigment, and includes a black pigment in an amount of 5% by weight ('wt. %') or less.

When the coloring agent (a1) does not include all of blue, red and yellow pigments, visible light transmittance is increased, thereby the formed pattern exhibits a color. Thus, it is not possible to be used as an infrared transmission pixel.

In particular, the pigment may include compounds classified as the pigment in the color index (published by the Society of Dyers and Colorists). More particularly, pigments with the following color index (C.I.) numbers may be exemplified, but it is not particularly limited thereto.

The blue pigment may include C.I. Pigment Blue 15 (15:3, 15:4, 15:6, etc.), 16, 21, 28, 60, 64, 76, or the like.

The red pigment may include C.I. Pigment Red 9, 97, 105, 122, 123, 144, 149, 166, 168, 176, 177, 179, 180, 192, 215, 216, 224, 242, 254, 255, 264, or the like.

The yellow pigment may include C.I. Pigment Yellow 20, 24, 31, 53, 83, 86, 93, 94, 109, 110, 117, 125, 137, 138, 139, 147, 148, 150, 153, 154, 166, 173, 180, 185, or the like. These pigments may be used alone or in combination of two or more thereof.

For example, C.I. Pigment Blue 15:6, C.I. Pigment Blue 16, C.I. Pigment Blue 60, or the like is used as the blue pigment;

C.I. Pigment Red 149, C.I. Pigment Red 177, C.I. Pigment Red 179, C.I. Pigment Red 242, C.I. Pigment Red 254, C.I. Pigment Red 255, or the like is used as the red pigment; and C.I. Pigment Yellow 138, C.I. Pigment Yellow 139, C.I. Pigment Yellow 150, C.I. Pigment Yellow 185, or the like is used as the yellow pigment. These pigments may be used alone or in combination of two or more thereof.

The coloring agent (a1) according to the present invention may include the blue pigment, the red pigment and the yellow pigment in an amount of 10 to 70 wt. %, respectively. When a content of each pigment is within the above range, it is possible to form an infrared transmission pixel which has a very low visible light transmittance and exhibits a high infrared transmittance. In such an aspect, for example, the coloring agent (a1) includes the blue pigment in an amount of 40 to 70 wt. %, the red pigment in an amount of 10 to 40 wt. % and the yellow pigment in an amount of 10 to 30 wt. %, and more particularly, the coloring agent (a1) includes the blue pigment in an amount of 50 to 70 wt. %, the red pigment in an amount of 10 to 30 wt. % and the yellow pigment in an amount of 10 to 30 wt. %.

The coloring agent according to an embodiment of the present invention may not include a black pigment in order to improve a straightness of the pattern and infrared transmittance, as well as suppress residue. Nevertheless, the coloring agent may include a black pigment in a small amount of 5 wt. % or less to a total weight of the coloring agent, but in an aspect of suppressing the above-described problem, the coloring agent may not include any black pigment according to an embodiment of the present invention.

The coloring agent (a1) according to the present invention may further include organic pigments, inorganic pigments, dyes, or the like typically used in the related art within a range without detriment to the objects of the present invention.

The organic pigment may include a variety of pigments used for print ink, ink-jet ink, etc., and, in particular, water-soluble azo pigments, water-insoluble azo pigments, phthalocyan pigments, quinacridon pigments, isoindolinone pigments, isoindoline pigments, perylene pigments, perynone pigments, dioxazine pigments, anthraquinone pigments, dianthraquinonyl pigments, anthrapyrimidine pigments, anthanthrone pigments, indanthrone pigments, flavanthrone pigments, pyranthrone pigments, diketopyrrolopyrrole pigments, or the like.

The inorganic pigment may include metallic compounds such as metal oxides or metal complexes, and particularly, oxides of metal selected from iron, cobalt, aluminum, cadmium, lead, copper, titanium, magnesium, chromium, zinc, or antimony, etc., or metal complex oxides thereof.

In particular, the organic pigment and inorganic pigment may include compounds classified as the pigment in the color index (published by the Society of Dyers and Colorists). More particularly, pigments with the following color index (C.I.) numbers may be exemplified, but it is not particularly limited thereto.

For example, the pigment may include C.I. Pigment Orange 13, 31, 36, 38, 40, 42, 43, 51, 55, 59, 61, 64, 65, and 71; C.I. Pigment Violet 14, 19, 23, 29, 32, 33, 36, 37 and 38; C.I. Pigment Green 7, 10, 15, 25, 36, 47 and 58; C.I Pigment Brown 28; or the like.

The pigment may be subjected to various treatments such as: a resin treatment; a surface treatment using pigment derivatives to which an acidic group or a basic group is introduced; a graft treatment onto a surface of pigment by using a polymer compound, etc.; an atomizing treatment by using a sulfuric acid atomization method; a washing treatment by using organic solvent or water for removing impurities; an ionic impurities removing treatment by using an ion exchange method; or the like, as necessary.

The dye may include any one without particular limitation thereof so long as it has solubility to organic solvents. In particular, dyes having solubility to the organic solvents while ensuring reliability such as solubility, heat-resistance and solvent-resistance to an alkaline developing solution may be used.

The dye may include any one selected from acid dye having an acidic group such as sulfonic acid or carboxylic acid; a salt of the acid dye with a nitrogen-containing compound; sulfonamides of the acid dye; and derivatives thereof. Besides, azo-, xanthenes- or phthalocyanine-based acid dyes, and derivative thereof, may also be selected.

For example, the dye includes compounds classified as dyes in the color index (published by the Society of Dyers and Colorists) or other known dyes described in Dyeing Note (Color Dyeing Co.).

Particular examples of the dye may include, as C.I. Solvent Dye, yellow pigments such as C.I. Solvent Yellow 4, 14, 15, 21, 23, 24, 38, 62, 63, 68, 82, 94, 98, 99, and 162; red pigments such as C.I. Solvent Red 8, 45, 49, 122, 125 and 130; orange pigments such as C.I. Solvent Orange 2, 7, 11, 15, 26 and 56; blue pigments such as C.I. Solvent Blue 35, 37, 59 and 67; green pigments such as C.I. Solvent Green 1, 3, 4, 5, 7, 28, 29, 32, 33, 34 and 35, or the like.

In addition, the dye may include, as C.I. Acid Dye, yellow pigments such as C.I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243 and 251;

red pigments such as C.I. Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422 and 426;

orange pigments such as C.I. Acid Orange 6, 7, 8, 10, 12, 26, 50, 51, 52, 56, 62, 63, 64, 74, 75, 94, 95, 107, 108, 169 and 173;

blue pigments such as C.I. Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335 and 340;

violet pigments such as C.I. Acid Violet 6B, 7, 9, 17 and 19;

green pigments such as C.I. Acid Green 1, 3, 5, 9, 16, 25, 27, 50, 58, 63, 65, 80, 104, 105, 106 and 109, or the like.

Further, the dye may include, as C.I. Direct Dye, yellow pigments such as C.I. Direct Yellow 2, 33, 34, 35, 38, 39, 43, 47, 50, 54, 58, 68, 69, 70, 71, 86, 93, 94, 95, 98, 102, 108, 109, 129, 136, 138 and 141;

red pigments such as C.I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246 and 250;

orange pigments such as C.I. Direct Orange 34, 39, 41, 46, 50, 52, 56, 57, 61, 64, 65, 68, 70, 96, 97, 106 and 107;

blue pigments such as C.I. Direct Blue 38, 44, 57, 70, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275 and 293;

violet pigments such as C.I. Direct Violet 47, 52, 54, 59, 60, 65, 66, 79, 80, 81, 82, 84, 89, 90, 93, 95, 96, 103 and 104;

green pigments such as C.I. Direct Green 25, 27, 31, 32, 34, 37, 63, 65, 66, 67, 68, 69, 72, 77, 79 and 82, or the like.

Furthermore, the dye may include, as C.I. Mordant Dye, yellow pigments such as C.I. Mordant Yellow 5, 8, 10, 16, 20, 26, 30, 31, 33, 42, 43, 45, 56, 61, 62 and 65;

red pigments such as C.I. Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94 and 95;

orange pigments such as C.I. Mordant Orange 3, 4, 5, 8, 12, 13, 14, 20, 21, 23, 24, 28, 29, 32, 34, 35, 36, 37, 42, 43, 47 and 48;

blue pigments such as C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84;

violet pigments such as C.I. Mordant Violet 1, 2, 4, 5, 7, 14, 22, 24, 30, 31, 32, 37, 40, 41, 44, 45, 47, 48, 53 and 58;

green pigments such as C.I. Mordant Green 1, 3, 4, 5, 10, 15, 19, 26, 29, 33, 34, 35, 41, 43 and 53, or the like.

The pigments or dyes may be used in combination of one or more thereof, respectively.

The coloring agent (a1) may be included in an amount of 40 to 70 wt. %, to a total weight of the infrared transmission photosensitive resin composition in terms of solid content, but it is not limited thereto.

The pigment dispersion composition (A) may include a dispersant (a2), a dispersion supplement (a3), and a dispersing solvent (a4) and, in order to achieve storage stability and facilitate dispersion, may further include a dispersion resin (a5).

(a2) Dispersant

The dispersant (a2) is added to allow de-coagulation and maintain stability of the pigment, and may include any one generally used in the related art without particular limitation thereof. For example, cationic, anionic, non-ionic, amphoteric, polyester, polyamine-based surfactants, or the like may be used as a dispersant, which may be used alone or in combination of two or more thereof, respectively.

For example, the dispersant (a2) includes an acrylate-based dispersant (hereinafter, referred to as an acrylate dispersant) such as butyl methacrylate (BMA) or N,N-dimethylaminoethyl methacrylate (DMAEMA). Commercially available products of the acrylate dispersant may include DISPER BYK-2000, DISPER BYK-2001, DISPER BYK-2070, DISPER BYK-2150, or the like. These acrylate dispersants may be used alone or in combination of two or more thereof, respectively.

The dispersant (a2) according to the present invention may include different resin type pigment dispersants, other than the above-described acrylate dispersant. Such different resin type pigment dispersants may include any known resin type pigment dispersant. In particular, water-soluble resin or water-soluble polymer compounds including polyurethane, polycarboxylic acid ester such as polyacrylate as a representative thereof, unsaturated polyamide, polycarboxylic acid, amine salts of polycarboxylic acid, ammonium salts of polycarboxylic acid, alkylamine salts of polycarboxylic acid, polysiloxane, long chain polyaminoamide phosphate salts, esters of hydroxyl group-substituted polycarboxylic acid and modified products thereof, amide formed by a reaction of polyester having free carboxyl group with poly (lower alkylenimne) or salts thereof, (meth)acrylic acid-styrene copolymer, (meth)acrylic acid-(meth)acrylate ester copolymer, styrene-maleic acid copolymer, polyvinyl alcohol, polyvinyl pyrrolidone, etc.; polyester; modified polyacrylate; addition products such as ethylene oxide/propylene oxide, phosphate ester, or the like, may be used.

Commercially available products of the resin type dispersants may include, as cationic resin dispersants, for example: DISPER BYK-160, DISPER BYK-161, DISPER BYK-162, DISPER BYK-163, DISPER BYK-164, DISPER BYK-166, DISPER BYK-171, DISPER BYK-182, and DISPER BYK-184 (trade name of BYK Chemicals); EFKA-44, EFKA-46, EFKA-47, EFKA-48, EFKA-4010, EFKA-4050, EFKA-4055, EFKA-4020, EFKA-4015, EFKA-4060, EFKA-4300, EFKA-4330, EFKA-4400, EFKA-4406, EFKA-4510, and EFKA-4800 (trade name of BASF Co.); SOLSPERS-24000, SOLSPERS-32550, NBZ-4204/10 (trade name of Lubirzol Co.); HINOACT T-6000, HINOACT T-7000, HINOACT T-8000 (trade name of Kawaken Fine Chemical Co.); AJISPUR PB-821, AJISPUR PB-822, AJISPUR PB-823 (trade name of Ajinomoto Co.); FLORENE DOPA-17HF, FLORENE DOPA-15BHF, FLORENE DOPA-33, FLORENE DOPA-44 (trade name of Kyoaisha Chemicals), or the like.

The different resin type pigment dispersants other than the above-described acrylate dispersant may be used alone or in combination of two or more thereof, and may be used together with the above-described acrylate dispersant.

The dispersant (a2) may be included in an amount of 1 to 50 parts by weight ('wt. parts'), and for example, 5 to 30 wt. parts, to 100 wt. parts of the pigments (including the coloring agent (a1)) in terms of solid content. When the content of the pigment dispersant is within the above range, a pigment having uniformly distributed particle diameter may be achieved. If the content of the dispersant (a2) exceeds 50 wt. parts, a viscosity may be increased, and if the amount thereof is less than 1 wt. parts, it is difficult to conduct micro-granulation of the pigment or it may occur a problem such as gelation after dispersion.

(a3) Dispersion Supplement

The dispersion supplement is an agent to disperse the pigment in a form of micro-particles to prevent them from being agglomerated again. Such a dispersion supplement is effective to form a color filter having a high contrast ratio and excellent transmittancy.

The dispersion supplement is not particularly limited but may use a dispersion compound represented by Formula 1 below, for example.

[Formula 1]

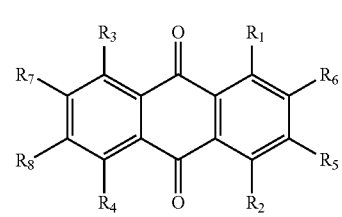

(wherein, $R_1$ to $R_4$ are each independently hydrogen, —OH or —NH—$R_9$, $R_5$ to $R_8$ are each independently hydrogen, halogen, or $SO_3^-$, and $R_9$ is hydrogen, a linear or non-linear alkyl group having 1 to 8 carbon atoms, or a substituent represented by Formula 2 below)

[Formula 2]

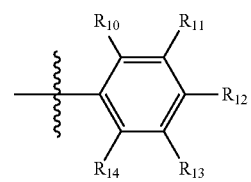

(wherein, $R_{10}$ to $R_{14}$ are each independently hydrogen atom, a linear or non-linear alkyl group having 1 to 4 carbon atoms, $SO_3^-$ or a substituent represented by Formula 3 below)

[Formula 3]

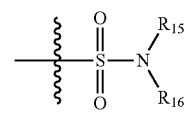

(wherein, $R_{15}$ is a hydrogen atom, $COR_{16}$, a linear or non-linear alkyl group having 1 to 8 carbon atoms, or a saturated or unsaturated ring
having 4 to 18 carbon atoms, and $R_{16}$ is a hydrogen atom, or an alkyl group having 1 to 8 carbon atoms).

The compound represented by Formula 1 is not particularly limited but may include, for example, 1,8-diamino-4,5-dihydroxyanthraquinone, 1,5-bis{[2-(diethylamino)ethyl]amino}anthra-9,10-quinone, 1,8-bis(benzamido)

anthraquinone, 1,4-bis{[2-(4-hydroxyphenyl)ethyl]amino}anthra-9,10-quinone, 1,4-bis{[2-(dimethylamino)ethyl]amino}-5,8-dihydroxyanthra-9,10-quinone, 1,8-dihydroxy-4-[4-(2-hydroxyethyl)anilino]-5-nnitroanthra-9,10-quinone, 1,4-dihydroxyanthraquinone, 1,4-bis(4-butylanilino)-5,8-dihydroxyanthraquinone, 4'-(4-hydroxy-1-anthraquinonylamino)-acetanilide, 1,4-bis[(2,6-diethyl-4-methylphenyl)amino]anthraquinone, 1,4-bis(butylamino)-9,10-anthracenedion, 1,4-bis(4-butylanilino)-5,8-dihydroyanthraquinone, 1,5-bis[(3-methylphenyl)amino]-9,10-anthracenedion, 1,5-dicyclohexylaminoanthraquinone, 1,4-bis(isopropylamino)anthraquinone, 1,4-bis(methylamino)anthraquinone, 1,4-bis(2,6-diethyl-4-methylanilino)anthraquinone, 2,2'-(9,10-dioxoanthracene-1,4-diyldimino)bis(5-methylsulfonate), 1-anilino-4-hydroxyanthraquinone, 1-hydroxy-4-[(4-methylphenyl)amino]-9,10-anthracenedion, 1,4-bis(para-tolylamino)anthraquinone, 1-amino-4-phenylaminoanthraquinone, N-[4-[(4-hydroxy-anthraquino-1-nyl)amino]phenyl]acetamide, 1-(methylamino)-4-(4-methylanilino)anthracene-9,10-dion and 1,4,5,8-tetrahydroxyanthraquinone, or the like. These compounds may be used alone or in combination of two or more thereof.

The dispersion supplement (a3) according to the present invention may further include commercially available products of the dispersion supplement. In particular, SOLSPERSE-5000, SOLSPERSE-12000, and SOLSPERSE-22000 (Lubrizol Co.), BYK-SYNERGIST 2100, and BYK-SINERGIST 2105 (BYK Co.), EFKA-6745, and EFKA-6750 (BASF Co.), or the like, may be used. These products may be used alone or in combination of two or more thereof.

The dispersion supplement (a3) may be included in an amount of 1 to 30 wt. parts, to 100 wt. parts of the pigments (including the coloring agent (a1)) in terms of solid content. If the content of the dispersion supplement (a3) exceeds 30 wt. parts, inherent color of the pigments may be deteriorated and further discolored by hard-baking in the preparation of a coloring layer.

(a4) Dispersing Solvent

The dispersing solvent (a4) is not particularly limited but may include different organic solvents generally used in the related art.

Particular examples of the dispersing solvent may include: diethyleneglycol dialkylethers; ethyleneglycol alkylether acetates; alkyleneglycol alkylether acetates; aromatic hydrocarbons; ketones; alcohols; cyclic esters; or the like. For example, alkylene glycol alkylether acetates; ketones; esters such as ethyl 3-ethoxypropionate, methyl 3-methoxypropionate, etc. are used, and more particularly, propylene glycol monomethyl ether acetate, propyleneglycol monoethyl ether acetate, cyclohexanone, ethyl 3-ethoxypropionate, methyl 3-methoxypropionate, etc. are used. These compounds may be used alone or in combination of two or more thereof.

The dispersing solvent (a4) may be included in an amount of 50 to 90 wt. %, and for example, 70 to 85 wt. % to a total weight of the pigment dispersion composition. If the content of the dispersing solvent is less than 50 wt. % or exceeds 90 wt. %, storage stability of the pigment dispersion composition may be deteriorated.

(a5) Dispersion Resin

The dispersion resin (a5) functions as a dispersing solvent of the coloring agent (a1), and may be added selectively. When the dispersant (a2) is mixed with the dispersion resin (a5) and used, it is possible to prepare a pigment dispersion composition with more excellent properties, than the case of using the dispersant (a2) alone.

The dispersion resin may include any one without particular limitation thereof so long as it can function as a dispersing solvent. However, in consideration of developing properties of a colored photosensitive resin composition prepared in a form of the pigment dispersion composition, a resin having an acid value may be used to achieve solubility to an alkaline developing solution. Herein, the acid value is a measurement value as an amount (mg) of potassium hydroxide required for neutralizing 1 g of acryl polymer and, in general, may be calculated by titration using a potassium hydroxide solution.

The dispersion resin having an acid value may be prepared by copolymerizing a compound (b1) having an unsaturated bond with a carboxyl group, and a compound (b2) having an unsaturated bond copolymerizable with the compound (b1), but it is not limited thereto.

Particular examples of the compound (b1) having an unsaturated bond with a carboxyl group may include monocarboxylic acid such as acrylic acid, methacrylic acid, crotonic acid, etc.; dicarboxylic acid such as fumaric acid, methaconic acid, itaconic acid, etc, and anhydrides of dicarboxylic acid; mono(meth)acrylate of a polymer having carboxyl and hydroxyl groups at both ends thereof such as ω-carboxypolycaprolactone mono(meth)acrylate, etc., and for example, acrylic acid and methacrylic acid. These compounds may be used alone or in combination of two or more thereof.

Particular examples of the compound (b2) having an unsaturated bond copolymerizable with the compound (b1) may include the following compounds, but it is not particularly limited thereto. Aromatic vinyl compounds; alkyl(meth)acrylates; alicyclic (meth)acrylates; aryl(meth)acrylates; hydroxyalkyl(meth)acrylates; N-substituted maleimide compounds; unsaturated amide compounds; unsaturated oxetane compounds, or the like may be used. These compounds may be used alone or in combination of two or more thereof.

The dispersion resin (a5) may be included in an amount of 1 to 50 wt. parts, and for example, 5 to 40 wt. parts, to 100 wt. parts of coloring agent (a1) in terms of solid content. If the content of the dispersion resin (a5) exceeds 50 wt. parts, the viscosity may be increased, and if the amount thereof is less than 1 wt. parts, the content of the dispersion resin is insufficient, thereby a micro-granulated pigment dispersion composition may not be obtained.

The pigment dispersion composition (A) may be included in an amount of 10 to 80 wt. %, and for example, 10 to 70 wt. % to a total weight of the infrared transmission photosensitive resin composition in terms of solid content.

(B) Alkaline Soluble Resin

The alkaline soluble resin (B) may be polymerized while including monomers represented by Formulae 4 to 7 below.

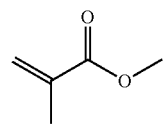

[Formula 4]

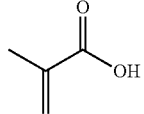

[Formula 5]

-continued

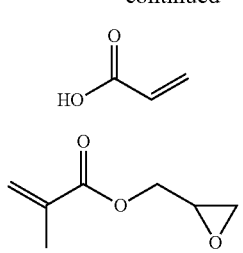

[Formula 6]

[Formula 7]

The monomer represented by Formulae 4 to 7 may be included and polymerized in an amount of 3 to 80 mol %, and for example, 5 to 70 mol %, to a total monomer which is included and polymerized in the alkaline soluble resin (B). When the mol % of the monomer is within the above range, it is possible to fabricate a pattern which does not occur delamination of pattern during a development process and has excellent sensitivity, adhesiveness and solvent-resistance.

The alkaline soluble resin (B) according to the present invention may be polymerized while further including a monomer copolymerizable with the monomers represented by Formulae 4 to 7.

For example, the monomer copolymerizable with the monomers represented by Formulae 4 to 7 may include aromatic vinyl compounds; alkyl(meth)acrylates; alicyclic (meth) acrylates; aryl(meth)acrylates; hydroxyalkyl(meth) acrylates; N-substituted maleimide compounds; unsaturated amide compounds; unsaturated oxetane compounds, or the like. These compounds may be used alone or in combination of two or more thereof.

If necessary, the alkaline soluble resin (B) according to the present invention may further include a variety of different alkaline soluble resins known and generally used in the related art by mixing therewith.

The alkaline soluble resin (B) may have a weight average molecular weight of 3,000 to 100,000, and for example, 5,000 to 50,000. If the weight average molecular weight of the alkaline soluble resin (B) is less than 3,000 or exceeds 100,000, a decrease in a film thickness may not be prevented during development, such that there is a disadvantage of missing a pattern portion.

The alkaline soluble resin (B) may have an acid value of 50 to 150 mg KOH/g. When the acid value is within the above range, solubility to the developing solution may be improved, and a residual layer rate may be increased. The alkaline soluble resin (B) may have an acid value of 60 to 140 mg KOH/g, for example, 80 to 135 mg KOH/g, and more particularly, 80 to 130 mg KOH/g. Herein, the acid value is a measurement value as an amount (mg) of potassium hydroxide required for neutralizing 1 g of acryl polymer and, in general, may be calculated by titration using a potassium hydroxide solution.

The alkaline soluble resin (B) may be included in an amount of 10 to 80 wt. %, and for example, 10 to 70 wt. %, to a total weight of the infrared transmission photosensitive resin composition in terms of solid content. When the content of the alkaline soluble resin (B) is within the above range, solubility to the developing solution may be sufficient to facilitate forming the pattern, and a decrease in a film thickness may be prevented, thereby missing of a non-pixel portion may be improved.

(C) Photo-polymerizable Compound

The photo-polymerizable compound (C) is not particularly limited, so long as it can be polymerized by activity of light and a photo-polymerization initiator to be described below, but may include mono-functional, bi-functional, or other tri-functional or higher poly-functional compound, etc.

Particular examples of the mono-functional monomer may include nonylphenylcarbitol acrylate, 2-hydroxy-3-phenoxypropyl acrylate, 2-ethylhexylcarbitol acrylate, 2-hydroxyethyl acrylate, N-vinyl pyrrolidone, etc., and commercially available products thereof may include Aronix M-101 (Toagosei Co.), KAYARAD TC-110S (Nippon Chemical Co.), Biscoat 158 (Osaka Yuki Kagaku Kogyo), etc.

Particular examples of the bi-functional monomer may include 1,6-hexanediol di(meth)acrylate, ethyleneglycol di(meth)acrylate, neopentylglycol di(meth)acrylate, triethyleneglycol di(meth)acrylate, bis(acryloyloxyethyl)ether of bisphenol A, 3-methylpentanediol di(meth)acrylate, etc., and commercially available products thereof may include Aronix M-210, M-1100, and 1200 (Toagosei Co.), KAYARAD HDDA (Nippon Chemical Co.), Biscoat 260 (Osaka Yuki Kagaku Kogyo), AH-600, AT-600, or UA-306H (Kyoeisha Chemical Co.), etc.

Particular examples of the tri-functional or higher poly-functional compound may include trimethylolpropane tri (meth)acrylate, ethoxylated trimethylolpropane tri(meth) acrylate, propoxylated trimethylolpropane tri(meth)acrylate, pentaerythritol tri(meth)acrylate, pentaerythritol tetra(meth) acrylate, dipentaerythritol penta(meth)acrylate, ethoxylated dipentaerythritol hexa(meth)acrylate, propoxylated dipentaerythritol hexa(meth)acrylate, dipentaerythritol hexa(meth)acrylate, etc., and commercially available products thereof may include Aronix M-309, TO-1382 (Toagosei Co.), KAYARAD TMPTA, KAYARAD DPHA, or KAYARAD DPHA-40H (Nippon Chemical Co.), etc.

Among the above examples of the photo-polymerizable compound, trifunctional or higher (meth)acrylic acid ester and urethane(meth)acrylate may be used in terms of superior polymerizability and enhanced strength.

The compounds exemplified as the photo-polymerizable compound (C) may be used alone or in combination of two or more thereof, respectively.

The photo-polymerizable compound (C) may be included in an amount of 5 to 45 wt. %, and for example, 7 to 45 wt. %, to a total weight of the infrared transmission photosensitive resin composition in terms of solid content. When the content of the photo-polymerizable compound (C) is within the above range, the pixel part may have favorable intensity or smoothness.

(D) Photo-polymerization Initiator

The photo-polymerization initiator (D) may use any compound without particular limitation thereof so long as it can polymerize the photo-polymerizable compound (C). In particular, the photo-polymerization initiator (D) may be at least one selected from a group consisting of acetophenone compounds, benzophenone compounds, triazine compounds, biimidazole compounds, oxime compounds, and thioxanthone compounds, etc., in terms of polymerization characteristics, initiation efficiency, absorption wavelength, availability, price, or the like.

Further, other photo-polymerization initiators may be additionally used together with the above initiator so long as they do not deteriorate effects of the present invention. These additional photo-polymerization initiators may include, for example, benzoin compounds, anthracene compounds, or the like, which may be used alone or in combination of two or more thereof.

In addition, the photo-polymerization initiator (D) may further include a photo-polymerization initiation enhancer (D-1) in order to improve the sensitivity of the infrared transmission photosensitive resin composition of the present invention. The infrared transmission photosensitive resin composition according to the present invention contains the photo-polymerization initiation enhancer (D-1), such that it is possible to improve productivity due to more increased sensitivity.

As the photo-polymerization initiation enhancer (D-1), at least one compound selected from a group consisting of amine compounds, carboxylic acid compounds, and organic sulfur compounds having a thiol group may be used.

The photo-polymerization initiator (D) may be included in an amount of 0.1 to 40 wt. %, and for example, 1 to 30 wt. % to a total weight of the infrared transmission photosensitive resin composition in terms of solid content. When the content of the photo-polymerization initiator (D) is within the above range, the infrared transmission photosensitive resin composition may become highly sensitive to reduce an exposure time, thereby improving the productivity while maintaining a high resolution. Further, the pixel portion formed by using the compounds satisfying the above-described conditions may have a favorable intensity, and good smoothness at the surface thereof.

In addition, when further using the photo-polymerization initiation enhancer (D-1), it may be used in the same content range as the photo-polymerization initiator (D). When the photo-polymerization initiation enhancer (D-1) is used in the above-described content, the infrared transmission photosensitive resin composition may have more increased sensitivity, and provide improved productivity of the color filter.

(E) Solvent

The solvent (E) may use any solvent without particular limitation thereof so long as it is generally used in a photoresist for a semiconductor in the related art. In particular, ethers; aromatic hydrocarbons; ketones; alcohols; esters; amides; or the like may be used.

Particular examples of the solvent (E) may include ethers; aromatic hydrocarbons; ketones; alcohols; esters; or the like.

Among the exemplified solvents, in consideration of application and drying properties, an organic solvent having a boiling point of 100° C. to 200° C. may be used, and for example, propyleneglycol monomethylether acetate, propyleneglycol monoethylether acetate, cyclohexanone, ethyl lactate, butyl lactate, 3-ethoxyethyl propionate, 3-methoxymethyl propionate, etc. are used. These solvents may be used alone or in combination of two or more thereof.

The solvent (E) may be included in an amount of 100 to 300 wt. parts, and for example, 150 to 250 wt. parts, to 100 wt. parts of the infrared transmission photosensitive resin composition in terms of solid content.

<Infrared Transmission Pixel, Color Filter Array and Image Sensor>

The present invention provides an infrared transmission pixel manufactured by the above-described infrared transmission photosensitive resin composition.

The infrared transmission pixel may be manufactured by, for example, applying the infrared transmission photosensitive resin composition to a substrate as described below, and then, photo-curing and developing the same to form a pattern.

First, applying the infrared transmission photosensitive resin composition to the substrate (in general, a silicon wafer) or a layer made of solids of the colored photosensitive resin composition, which is previously formed, and then, heating and drying the same to remove volatile components such as the solvent, and thereby a smooth coat film is obtained.

Applying the composition may be performed by an application method such as, for example, spin-coating, flexible coating, roll coating, slit & spin coating, or slit coating, or the like. After the application, volatile components such as the solvent are volatilized by heating and drying (free-baking) or vacuum drying then heating the substrate. Herein, generally, heating is performed at a temperature of 70 to 200° C., and for example, 80 to 130° C. A film thickness after heating and drying generally ranges from 0.5 to 1.5 μm. The prepared film is irradiated with UV-ray through a mask for forming a pattern. In this case, in order to uniformly irradiate an entire exposed part with parallel light beam and correctly perform positioning between the mask and the substrate, a device such as a mask aligner or stepper may be used. When irradiating the film with UV-ray, the irradiated portion becomes cured.

Such UV-ray as described above may include g-beam (wavelength: 436 nm), h-beam, i-beam (wavelength: 365 nm), or the like. An amount of UV-ray irradiation may be suitably selected, but the present invention is not particularly limited thereto. The film obtained after curing may contact with the developing solution to dissolve and develop an unexposed part, thereby forming a pattern with a desired shape.

The development method used herein may include any one including liquid addition, dipping, spraying, or the like. Further, the substrate may be inclined at any angle during development. The developing solution is a water-soluble solution containing an alkaline compound and a surfactant. The alkaline compound may be any one selected from inorganic and organic alkaline compounds. Particular examples of the inorganic alkaline compound may include sodium hydroxide, potassium hydroxide, disodium hydrophosphate, sodium dihydrophosphate, diammonium hydrophosphate, ammonium dihydrophosphate, dihydropotassium phosphate, sodium silicate, potassium silicate, sodium carbonate, potassium carbonate, sodium hydrocarbonate, potassium hydrocarbonate, sodium borate, potassium borate, ammonia, or the like. In addition, particular examples of the organic alkaline compound may include tetramethyl ammonium hydroxide, 2-hydroxyethyltrimethylammonium hydroxide, monomethylamine, dimethylamine, trimethylamine, monoethylamine, diethylamine, triethylamine, monoisopropylamine, diisopropylamine, ethanolamine, or the like.

These inorganic and organic alkaline compounds may be used alone or in combination of two or more thereof, respectively. A concentration of the alkaline compound in the alkaline developing solution may range from 0.01 to 10 wt. %, and for example, from 0.03 to 5 wt. %.

The surfactant of the alkaline developing solution may use at least one selected from a group consisting of non-ionic surfactants, anionic surfactants or cationic surfactants.

Particular examples of the non-ionic surfactant may include polyoxyethylene alkylether, polyoxyethylene arylether, polyoxyethylene alkylarylether, other polyoxyethylene derivatives, oxyethylene/oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester, polyoxyethylene alkylamine, or the like.

Particular examples of the anionic surfactant may include higher alcohol sulfuric acid ester salts such as laurylalcohol sulfuric acid ester sodium or olerylalcohol sulfuric acid ester sodium, alkyl sulfuric acid salts such as sodium lauryl sulfate or ammonium lauryl sulfate, alkylaryl sulfonic acid salts such as sodium dodecylbenzene sulfonate or sodium dodecylnaphthalene sulfonate, or the like.

Particular examples of the cationic surfactant may include amine salts such as stearylamine hydrochloride or laurylt-rimethyl ammonium chloride, quaternary ammonium salts, or the like. These surfactants may be used alone or in combination of two or more thereof.

A concentration of the surfactant in the developing solution may range from 0.01 to 10 wt. %, for example, from 0.05 to 8 wt. %, and more particularly, from 0.1 to 5 wt. %. After the development, the resulting product is washed and may be optionally subjected to post baking at 150 to 230° C. for 3 to 10 minutes.

The infrared transmission pixel of the present invention exhibits a low transmittance in the visible light region, and exhibits a high transmittance in the infrared region. In particular, when the infrared transmission pixel has a film thickness of 1 μm, the transmittance at a wavelength of 390 nm may be 10% or less, the transmittance at a wavelength of 650 nm may be 40% or less, and the transmittance at wavelength in a range of 720 nm to 1100 nm may be 90%.

Further, the present invention provides a color filter array including the above-described infrared transmission pixel, and an image sensor including the color filter array.

Therefore, the pattern obtained as described above may be usefully used in the color filter array of the image sensor, and has advantages such as excellent shielding properties for visible light and IR permeability, as well as superior heat resistance and chemical stability (solvent resistance) due to improved adhesiveness to the substrate while having high cross-link density at a low exposure amount.

Hereinafter, exemplary embodiments will be described to more concretely understand the present invention with reference to examples and comparative examples. However, those skilled in the art will appreciate that such embodiments are provided for illustrative purposes and do not limit subject matters to be protected as disclosed in the detailed description and appended claims. Therefore, it will be apparent to those skilled in the art various alterations and deformations of the embodiments are possible within the scope and spirit of the present invention and duly included within the range as defined by the appended claims.

SYNTHESIS EXAMPLE 1

Synthesis of Alkaline Soluble Resin (B)

A flask equipped with a stirrer, a thermometer, a reflux cooling tube, a dropping lot and a nitrogen inflow duct was prepared, and then, 40 wt. parts of a mixture of 3,4-epoxytricyclodecan-8-yl(meth)acrylate and 3,4-epoxytricyclodecan-9-yl(meth)acrylate (50:50 molar ratio), 50 wt. parts methyl methacrylate, 40 wt. parts of acrylic acid, 70 wt. parts of vinyl toluene, 4 wt. parts of t-butylperoxy-2-ethyl hexanoate and 40 wt. parts of propyleneglycol monomethylether acetate (PGMEA) were introduced into the flask, agitated and mixed together to prepare a monomer. Then, 6 wt. parts of n-dodecanethiol and 24 wt. parts of PGMEA were added to the flask, followed by agitating and mixing it to prepare a chain transfer agent as a dropping tank.

Thereafter, 395 wt. parts of PGMEA was introduced into the flask, and then, the flask was warmed to a temperature of 90° C. while substituting nitrogen for air atmosphere in the flask and agitating the same. Following this, loading of the monomer and the chain transfer agent was started from a dropping lot. Each of the loading was executed for 2 hours while maintaining the temperature of flask at 90° C., and after 1 hour, the temperature was raised to 110° C. and maintained for 5 hours. As a result, a resin (A-1) with an acid value of 100 mg KOH/g in terms of solid content was obtained. The obtained resin had a weight average molecular weight of 15,000 g/mol measured by GPC in terms of polystyrene, and a distribution of molecular weights (Mw/Mn) was 1.9.

Measurement of the weight average molecular weight (Mw) and the number average molecular weight (Mn) of the alkaline soluble resin were executed by a GPC method under the following conditions.

Apparatus: HLC-8120 GPC (manufactured by Doso Co. Ltd.)

Column: TSK-GELG4000HXL+TSK-GELG2000HXL (series connection)

Column temperature: 40° C.

Mobile phase solvent: Tetrahydrofuran

Flow rate: 1.0 ml/min

Input amount: 50 ml

Detector: RI

Concentration of measured sample: 0.6 wt. % (solvent=tetrahydrofuran)

Standard substance for calibration: TSK STANDARD POLYSTYRENE F-40, F-4, F-1, A-2500, and A-500 (manufactured by Doso Co. Ltd.)

A ratio of the weight average molecular weight and the number average molecular weight measured above was defined as a molecular weight distribution (Mw/Mn).

PREPARATIVE EXAMPLE

Preparation of Pigment Dispersion Composition

Pigment dispersion compositions of Preparative Examples 1 to 6 and Comparative Preparative Examples 1 to 3 were prepared in accordance with the contents shown in Table 1 below. In particular, the pigment dispersion compositions were prepared according to the parts by weight shown in Table 1 below. More particularly, the pigment dispersion compositions ware prepared by mixing and dispersing a coloring agent, dispersion resin (a copolymer of methacrylic acid and benzyl methacrylate, which has a ratio of 31:69 in a molar ratio of a methacrylic acid unit and a benzyl methacrylate unit, and a weight average molecular weight of 15,000 g/mol in terms of polystyrene), dispersant, AJUSPUR PB-821 (Ajinomoto Co.) and BYK-180 (manufactured by BYK Co.) as a dispersion supplement, and propylene glycol methyl ether acetate as a dispersing solvent, according to the parts by weight shown in Table 1 below, for 2 hours by means of a bead-mill.

TABLE 1

| Section | (a1) Coloring agent | | | | (a2) Dispersant | (a3) Dispersion supplement | (a4) Dispersing solvent | (a5) Dispersion resin |
|---|---|---|---|---|---|---|---|---|
| | R254 | Y139 | B15:6 | CB | | | | |
| Preparative Example 1 | 20 | 10 | 20 | 0 | 3 | 2 | 100 | 10 |
| Preparative Example 2 | 15 | 10 | 25 | 0 | 3 | 2 | 100 | 10 |
| Preparative Example 3 | 10 | 10 | 30 | 0 | 3 | 2 | 100 | 10 |
| Preparative Example 4 | 9.5 | 9.5 | 28.5 | 2.5 | 3 | 2 | 100 | 10 |
| Comparative Preparative Example 1 | 25 | 0 | 25 | 0 | 3 | 2 | 100 | 10 |
| Comparative Preparative Example 2 | 25 | 25 | 0 | 0 | 3 | 2 | 100 | 10 |
| Comparative Preparative Example 3 | 5 | 5 | 15 | 25 | 3 | 2 | 100 | 10 |
| Comparative Preparative Example 4 | 0 | 0 | 0 | 50 | 3 | 2 | 100 | 10 |
| Comparative Preparative Example 5 | 9 | 9 | 27 | 5 | 3 | 2 | 100 | 10 |

R254: Pigment Red 254
B15:6: Pigment Blue 15:6 (Fastogen Blue EP-193, manufactured by DIC Co.)
Y139: Pigment Yellow 139 (Fanchon Yellow 139, manufactured by DIC Co.)
CB (Carbon Black): Pigment Black 7 (manufactured by Mitsubishi Co.)

EXAMPLES AND COMPARATIVE EXAMPLES

Infrared transmission photosensitive resin compositions were prepared in accordance with the contents shown in Table 2 below. In particular, the infrared transmission photosensitive resin compositions of Examples 1 to 4 and Comparative Examples 1 to 5 were prepared by mixing the alkaline soluble resin prepared by Synthesis Example 1, the pigment dispersion compositions prepared in the preparative examples and the comparative preparative examples, KAY-ARAD DPHA (manufactured by Nippon Chemical Co.) as a photo-polymerizable compound, Irgacure OXE01 (manufactured by BASF Co.) as a photo-polymerization initiator, and propylene glycol monomethylether acetate as a solvent, according to the parts by weight shown in Table 2 below.

TABLE 2

| Section | (A) Pigment dispersion composition | | (B) Alkaline soluble resin | (C) Photo-polymerizable compound | (D) Photo-polymerization initiator | (E) Solvent |
|---|---|---|---|---|---|---|
| Example 1 | Preparative Example 1 | 165 | 48.1 | 9.4 | 1.6 | 75.9 |
| Example 2 | Preparative Example 2 | 165 | 48.1 | 9.4 | 1.6 | 75.9 |
| Example 3 | Preparative Example 3 | 165 | 48.1 | 9.4 | 1.6 | 75.9 |
| Example 4 | Preparative Example 4 | 165 | 48.1 | 9.4 | 1.6 | 75.9 |
| Comparative Example 1 | Comparative Preparative Example 1 | 165 | 48.1 | 9.4 | 1.6 | 75.9 |
| Comparative Example 2 | Comparative Preparative Example 2 | 165 | 48.1 | 9.4 | 1.6 | 75.9 |
| Comparative Example 3 | Comparative Preparative Example 3 | 165 | 48.1 | 9.4 | 1.6 | 75.9 |
| Comparative Example 4 | Comparative Preparative Example 4 | 165 | 48.1 | 9.4 | 1.6 | 75.9 |
| Comparative Example 5 | Comparative Preparative Example 5 | 165 | 48.1 | 9.4 | 1.6 | 75.9 |

Patterns were prepared on a silicon wafer using the infrared transmission photosensitive resin compositions prepared in Examples 1 to 4 and Comparative Examples 1 to 5. In particular, after applying each of the infrared transmission photosensitive resin composition to a silicon wafer by spin coating, the coated substrate was placed on a heating plate and left as it is at a temperature of 100° C. for 90 seconds, to form a thin film. Next, a test photo-mask having a pattern with stepwise-varied transmittance in a range of 1 to 100%, and a square pattern with a size of 1.5 μm and 2.0 μm was placed on the thin film, and then the thin film was irradiated with UV rays. In this case, an i-line stepper was used during exposure. The UV irradiated thin film was immersed in a 0.4 to 1.0% TMAH water-soluble developing solution for 1 minute to thus develop the same. After washing the silicon wafer coated with the above thin film by using distilled water, it was dried by heating in a heating oven at 220° C. for 3 minutes to fabricate patterns. The fabricated patterns had a line width of 1.0 μm.

EXPERIMENTAL EXAMPLE

The patterns obtained as described above were subjected to assessment of physical properties as follows, and results thereof are listed in Table 3 below.

1. Measurement of Visible Light and Infrared Transmittance

Transmittance in the visible light region of the fabricated pattern at a wavelength of 300 nm to 1,100 nm was measured, and then transmittance in the infrared region thereof at a wavelength of 720 nm was measured. Measured results are shown in Table 3 below.

2. Assessment of Pattern Shape and Residue

Using a CD-SEM (8100XP; manufactured by KLA-Tencor Co.), a size of the obtained patterns was measured, and the fabricated patterns were observed to determine straightness and residue of the pattern, and sagging thereof, and the observed results are shown in Table 3 below.

<Standard for Assessment>
Straightness of the pattern
1: very poor, 2: poor, 3: normal, 4: good, 5: excellent
Residue
1: very poor, 2: poor, 3: normal, 4: good, 5: excellent

TABLE 3

| Section | Transmittance | | | Pattern characteristic | |
| --- | --- | --- | --- | --- | --- |
| | 390 nm | 650 nm | 720 nm | Straightness | Residue |
| Example 1 | 10.0% | 39.8% | 94.7% | 4 | 5 |
| Example 2 | 9.7% | 32.8% | 94.3% | 5 | 5 |
| Example 3 | 9.1% | 26.6% | 93.0% | 5 | 5 |
| Example 4 | 5.0% | 14.5% | 90.0% | 3 | 2 |
| Comparative Example 1 | 24.0% | 34.0% | 95.9% | 4 | 5 |
| Comparative Example 2 | 9.20% | 95.2% | 98.10% | 4 | 4 |
| Comparative Example 3 | 10.50% | 16.70% | 52.40% | 3 | 2 |
| Comparative Example 4 | 11.20% | 1.10% | 10.50% | 1 | 1 |
| Comparative Example 5 | 5.1% | 8.4% | 85.4% | 1 | 1 |

Referring to Table 3, it could be seen that the infrared transmission pixels manufactured by the infrared transmission photosensitive resin compositions of the examples had a low visible light transmittance and a high infrared transmittance, as well as exhibited excellent straightness of the pattern with no residue occurred therein.

However, it could be seen that the infrared transmission pixels manufactured by the infrared transmission photosensitive resin compositions of the comparative examples had a high visible light transmittance or a low infrared transmittance, and in particular, exhibited poor straightness of the pattern and residue occurred therein.

What is claimed is:

1. An infrared transmission photosensitive resin composition, comprising:
   (A) a pigment dispersion composition including a coloring agent (a1);
   (B) an alkaline soluble resin;
   (C) a photo-polymerizable compound;
   (D) a photo-polymerization initiator; and
   (E) a solvent,
   wherein the coloring agent (a1) consists of a blue pigment in an amount of 50 to 70% by weight, a red pigment in an amount of 10 to 30% by weight, a yellow pigment in an amount of 10 to 30% by weight and a black pigment in an amount of less than 5% by weight, based on the total weight of the coloring agent.

2. The infrared transmission photosensitive resin composition according to claim 1, wherein the coloring agent (a1) is included in an amount of 40 to 70% by weight, to a total weight of the infrared transmission photosensitive resin composition in terms of solid content.

3. The infrared transmission photosensitive resin composition according to claim 1, wherein the blue pigment includes at least one selected from a group consisting of C.I. Pigment Blue 15:3, 15:4, 15:6, 16, 21, 28, 60, 64 and 76,
   the red pigment includes at least one selected from a group consisting of C.I. Pigment Red 9, 97, 105, 122, 123, 144, 149, 166, 168, 176, 177, 179, 180, 192, 215, 216, 224, 242, 254, 255 and 264, and
   the yellow pigment includes at least one selected from a group consisting of C.I. Pigment Yellow 20, 24, 31, 53, 83, 86, 93, 94, 109, 110, 117, 125, 137, 138, 139, 147, 148, 150, 153, 154, 166, 173, 180 and 185.

4. The infrared transmission photosensitive resin composition according to claim 1, wherein the composition comprises 10 to 80% by weight of the (A) pigment dispersion composition, 10 to 80% by weight of the (B) alkaline soluble resin, 5 to 45% by weight of the (C) photo-polymerizable compound, and 0.1 to 40% by weight of the (D) photo-polymerization initiator, to a total weight of the infrared transmission photosensitive resin composition in terms of solid content, and
   100 to 300 parts by weight of the (E) solvent, to 100 parts by weight of the infrared transmission photosensitive resin composition in terms of solid content.

5. An infrared transmission pixel which is manufactured by the infrared transmission photosensitive resin composition according to claim 1.

6. The infrared transmission pixel according to claim 5, wherein a transmittance at a wavelength of 390 nm is 10% or less, the transmittance at of 650 nm is 40% or less, and the transmittance at wavelength in a range of 720 nm to 1100 nm is 90%.

7. A color filter array comprising the infrared transmission pixel according to claim 5.

8. An image sensor comprising the color filter array according to claim 7.

* * * * *